United States Patent
Hsu et al.

(10) Patent No.: US 9,449,140 B2
(45) Date of Patent: Sep. 20, 2016

(54) CONFLICT DETECTION FOR SELF-ALIGNED MULTIPLE PATTERNING COMPLIANCE

(71) Applicant: Taiwan Semiconductor Manufacturing Company Limited, Hsin-Chu (TW)

(72) Inventors: Chin-Chang Hsu, Banqiao (TW); HungLung Lin, Hsinchu (TW); Ying-Yu Shen, Chiayi (TW); Wen-Ju Yang, Hsinchu (TW); Ken-Hsien Hsieh, Tapei (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 14/967,481

(22) Filed: Dec. 14, 2015

(65) Prior Publication Data

US 2016/0098513 A1 Apr. 7, 2016

Related U.S. Application Data

(62) Division of application No. 14/326,553, filed on Jul. 9, 2014, now Pat. No. 9,213,790, which is a division of application No. 13/747,684, filed on Jan. 23, 2013, now Pat. No. 8,782,575.

(51) Int. Cl.
*G06F 17/50* (2006.01)
*G03F 7/20* (2006.01)

(52) U.S. Cl.
CPC ....... *G06F 17/5081* (2013.01); *G06F 17/5072* (2013.01); *G03F 7/70466* (2013.01); *G03F 7/70475* (2013.01)

(58) Field of Classification Search
CPC ........... G06F 17/5081; G06F 17/5072; G03F 7/70466; G03F 7/70475
See application file for complete search history.

(56) References Cited

U.S. PATENT DOCUMENTS

| | | | | |
|---|---|---|---|---|
| 7,945,870 B2* | 5/2011 | Kahng | ............... | G06F 17/5081 716/111 |
| 7,972,959 B2* | 7/2011 | Mebarki | ............ | H01L 21/0337 257/E21.295 |
| 8,151,225 B2* | 4/2012 | Maeda | ................... | G03F 1/144 378/35 |
| 8,234,599 B2* | 7/2012 | Sahouria | ............... | G03F 1/144 716/104 |
| 8,245,174 B2* | 8/2012 | Cheng | ............... | G06F 17/5068 716/126 |
| 8,261,214 B2* | 9/2012 | Maeda | ............... | G06F 17/5068 716/50 |
| 8,312,394 B2* | 11/2012 | Ban | .................... | G06F 17/5068 716/50 |
| 8,448,100 B1* | 5/2013 | Lin | .......................... | G03F 1/70 716/50 |
| 8,473,874 B1* | 6/2013 | Sharma | .............. | G06F 17/5081 700/120 |

(Continued)

*Primary Examiner* — Naum B Levin
(74) *Attorney, Agent, or Firm* — Cooper Legal Group, LLC

(57) ABSTRACT

Among other things, one or more techniques and systems for performing design layout are provided. An initial design layout is associated with an electrical component, such as a standard cell. A conflict graph is generated based upon the initial design layout. The conflict graph comprises one or more nodes, representing polygons within the initial design layout, connected by one or more edges. A same-process edge specifies that two nodes are to be generated by the same pattern process, while a different-process edge specified that two nodes are to be generated by different pattern processes, such as a mandrel pattern process and a passive fill pattern process. The conflict graph is evaluated to identify a conflict, such as a self-aligned multiple pattering (SAMP) conflict, associated with the initial design layout. The conflict is visually displayed so that the initial design layout can be modified to resolve the conflict.

20 Claims, 7 Drawing Sheets

(56) References Cited

U.S. PATENT DOCUMENTS

| | | | | |
|---|---|---|---|---|
| 8,516,402 B1* | 8/2013 | Wang | ............ | G03F 1/70 716/52 |
| 8,516,403 B2* | 8/2013 | Abou Ghaida | ..... | G06F 17/5068 716/52 |
| 8,647,893 B1* | 2/2014 | Agarwal | ............ | G06F 17/5081 257/E21.522 |
| 8,782,586 B2* | 7/2014 | Sezginer | ............ | G06F 17/5077 716/126 |
| 2010/0023914 A1* | 1/2010 | Sahouria | ............ | G03F 1/144 716/50 |
| 2010/0153905 A1* | 6/2010 | Maeda | ............ | G06F 17/5068 716/54 |
| 2010/0191357 A1* | 7/2010 | Maeda | ............ | G06F 17/5068 700/97 |
| 2010/0229145 A1* | 9/2010 | Sahouria | ............ | G03F 1/144 716/124 |
| 2011/0014786 A1* | 1/2011 | Sezginer | ............ | G06F 17/5077 438/618 |
| 2011/0197168 A1* | 8/2011 | Chen | ............ | G06F 17/5081 716/50 |
| 2012/0137261 A1* | 5/2012 | Ban | ............ | G06F 17/5068 716/52 |
| 2012/0219917 A1* | 8/2012 | McGuinness | ....... | G03F 7/70466 430/312 |
| 2012/0288786 A1* | 11/2012 | Huang | ............ | G03F 1/36 430/5 |
| 2013/0074024 A1* | 3/2013 | Chase | ............ | G06F 17/5081 716/112 |

* cited by examiner

US 9,449,140 B2

CONFLICT DETECTION FOR SELF-ALIGNED MULTIPLE PATTERNING COMPLIANCE

RELATED APPLICATION(S)

This application is a divisional of U.S. Pat. No. 8,782,575, titled "CONFLICT DETECTION FOR SELF-ALIGNED MULTIPLE PATTERNING COMPLIANCE" which issued on Jul. 15, 2014. This application claims priority to U.S. Pat. No. 8,782,575 by way of U.S. patent application Ser. No. 14/326,553, titled "CONFLICT DETECTION FOR SELF-ALIGNED MULTIPLE PATTERNING COMPLIANCE" and filed on Jul. 9, 2014. U.S. Pat. No. 8,782,575 and U.S. patent application Ser. No. 14/326,553 are incorporated herein by reference. U.S. patent application Ser. No. 14/326,553 issued as U.S. Pat. No. 9,213,790.

BACKGROUND

Electronic design tools allow designers to layout, simulate, and analyze electrical components, such as standard cells and integrated circuits. In an example, a designer may create a design layout for a standard cell. Once the design layout is complete, complex post processing is used to make the design layout self-aligned multiple patterning (SAMP) compliant. For example, the design layout is adjusted using mandrel pattern and passive fill pattern. A trim mask is used to either retain a portion of the design layout covered by the trim mask to create a final layout or to remove a portion of the design layout covered by the trim mask to create the final layout.

SUMMARY

This summary is provided to introduce a selection of concepts in a simplified form that are further described below in the detailed description. This summary is not intended to identify key factors or essential features of the claimed subject matter, nor is it intended to be used to limit the scope of the claimed subject matter.

One or more techniques and systems for performing design layout are provided herein. In some embodiments, the design layout corresponds to an electrical component, such as a standard cell configured to provide logic-based functionality or storage functionality. The electrical component can be designed using at least one of a mandrel pattern or a passive fill pattern. Because the design layout can conflict with physical space constraints associated with using mandrel pattern or passive fill pattern, conflicts of the design layout can be identified and resolved for verification of the design layout as self-aligned multiple patterning (SAMP) compliant as provided herein.

In some embodiments of detecting a conflict, an initial design layout associated with an electrical component is received. A conflict graph is generated from the initial design layout. The conflict graph comprises one or more nodes connected by one or more edges. A node represents a polygon, corresponding to a portion of the electrical component, within the initial design layout. An edge corresponds to either a same-process edge type or a different-process edge type. The same-process edge type specifies that two polygons represented by two nodes connected by a same-process edge are to be generated by the same patterning process. For example, a same-process edge connects a first node and a second node that are both to be generated by a first pattern process, such as either a mandrel pattern process or a passive fill pattern process. The different-process edge type specifies that two polygons represented by two nodes connected by a different-process edge are to be generated by different patterning processes. For example, a different-process edge connects a first node that is to be generated by the first pattern process, such as the mandrel pattern process, and a second node that is to be generated by a second pattern process, such as the passive fill pattern process.

Responsive to the conflict graph comprising at least one same-process edge, a first cluster one node and a second cluster one node connected by a first same-process edge are clustered into a first multi-node cluster for inclusion within a cluster graph. In an example, a cluster one node is a node that can be included within the first multi-node cluster based upon the cluster one node being connected to another cluster one node by a same-process edge. For example, a third cluster one node that is connected by a same-process edge to at least one of the first cluster one node or the second cluster one node is clustered into the first multi-node cluster for inclusion within the cluster graph. In an example, one or more multi-node clusters are generated for inclusion within the cluster graph. For respective unclustered nodes, an unclustered node is included within the cluster graph as a single node cluster. In this way, the cluster graph, comprising one or more node clusters, is generated. For respective loops within the cluster graph, a conflict associated with the initial design layout is identified based upon a loop comprising an odd number of node clusters. As a simple example, the conflict can correspond to a first node connected to a second node by both a same-process edge and a different-process edge. A similarity rule that the first node and the second node are to be generated by the same pattern process, as specified by the same-process edge, and a difference rule that the first node and the second node are to be formed by different pattern processes, as specified by the different-process edge, cannot both be satisfied. In an example, the conflict is displayed within a visualization of the initial design layout. In another example, a spacing constraint recommendation, used to adjust spacing between one or more polygons within the initial design layout in order to resolve the conflict, is displayed. In this way, the initial design layout is modified, and a design layout that can be verified as self-aligned multiple patterning (SAMP) compliant is generated.

In some embodiments of detecting a conflict, an initial design layout associated with an electrical component is received. An initial representation of the initial design layout is generated. The initial representation comprises one or more nodes, representing polygons within the initial design layout that correspond to portions of the electrical component, connected by one or more edges, such as a same-process edge or a different-process edge. Responsive to the initial representation comprising at least one same-process edge, one or more same-process edges are merged into the initial design layout to generate a merged design layout. A conflict graph is generated based upon the merged design layout. The conflict graph comprises one or more nodes connected by one or more different-process edges. For respective loops within the conflict graph, a conflict associated with the initial design layout is identified based upon a loop comprising an odd number of nodes. In this way, the conflict is visually illustrated so that appropriate action can be taken to resolve the conflict so that an SAMP compliant design layout can be generated.

The following description and annexed drawings set forth certain illustrative aspects and implementations. These are indicative of but a few of the various ways in which one or more aspects can be employed. Other aspects, advantages, and novel features of the disclosure will become apparent from the following detailed description when considered in conjunction with the annexed drawings.

DETAILED DESCRIPTION

Figure 1:
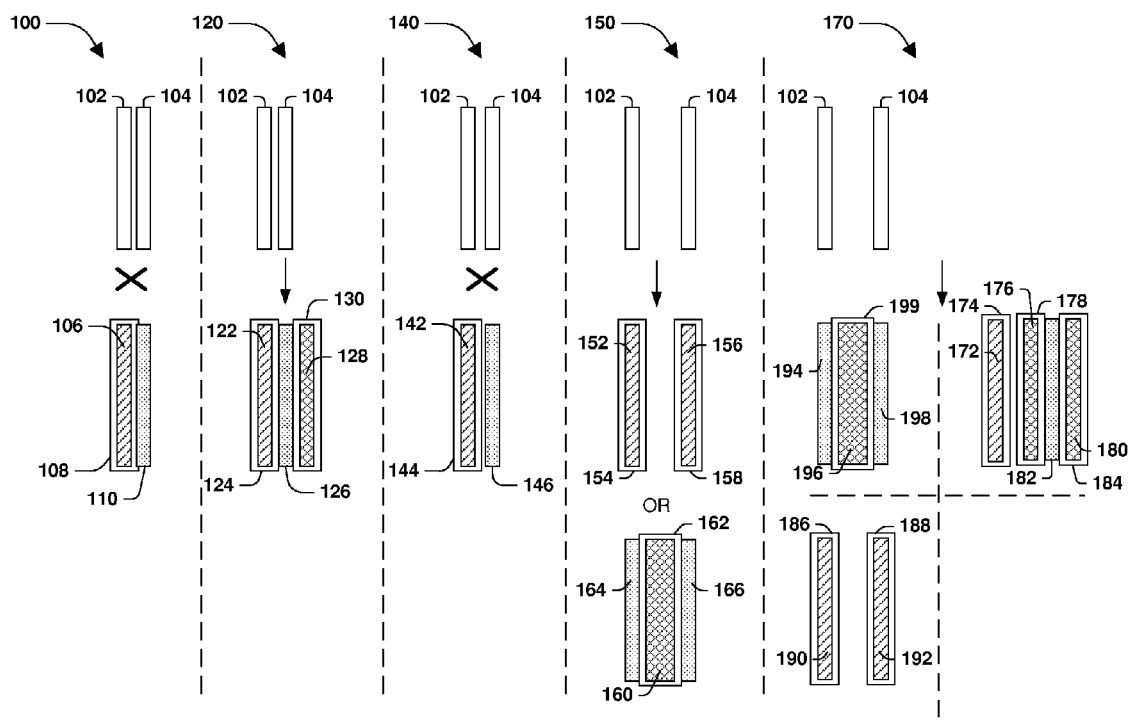
FIG. 1 is an illustration of one or more space threshold ranges, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

FIG. 1 illustrates an example, according to some embodiments, of one or more spacing threshold ranges. In an example, a first spacing threshold range 100 corresponds to a first spacing, such as a relatively small spacing between a first polygon 102 and a second polygon 104. In an example, the first polygon 102 and the second polygon 104 cannot be physically manufactured using mandrel pattern or passive fill pattern based upon the first spacing. For example, a first mandrel pattern 106 is formed as the first polygon 102. Spacer material 108 is formed around the first mandrel pattern 106. Neither a second mandrel pattern nor a passive fill pattern, such as a passive fill pattern 110, can be physically formed as the second polygon 104 at the first spacing from the first polygon 102.

In an example, a second spacing threshold range 120 corresponds to a second spacing between the first polygon 102 and the second polygon 104. For example, the second spacing is relatively larger than the first spacing corresponding to the first spacing threshold range 100. The first polygon 102 is represented by a first mandrel pattern 122 surrounded by a first spacer material 124. The second polygon 104 is represented by a passive fill pattern 126 formed between the first spacer material 124 of the first mandrel pattern 122 and a second spacer material 130 of a second mandrel pattern 128, such as a dummy mandrel pattern used merely to form the passive fill pattern 126. In this way, the first polygon 102 and the second polygon 104 can be formed at the second spacing based upon a different-process pattern rule specifying that the first polygon 102 and the second polygon 104 are to be formed from different pattern processes, such as mandrel pattern for the first polygon 102 and the passive fill pattern for the second polygon 104.

In an example, a third spacing threshold range 140 corresponds to a third spacing between the first polygon 102 and the second polygon 104. For example, the third spacing is relatively larger than the second spacing corresponding to the second spacing threshold range 120. In an example, the first polygon 102 and the second polygon 104 cannot be physically manufactured using mandrel pattern or passive fill pattern based upon the third spacing. For example, a first mandrel pattern 142 is formed as the first polygon 102. Spacer material 144 is formed around the first mandrel pattern 142. Neither a second mandrel pattern nor a passive fill pattern, such as a passive fill pattern 146, can be physically formed as the second polygon 104 at the third spacing from the first polygon 102.

In an example, a fourth spacing threshold range 150 corresponds to a fourth spacing between the first polygon 102 and the second polygon 104. For example, the fourth spacing is relatively larger than the third spacing corresponding to the third spacing threshold range 140. Based upon the fourth spacing, the first polygon 102 and the second polygon 104 can be formed based upon a same-process pattern rule specifying that the first polygon 102 and the second polygon 104 are to be formed from the same pattern process. In an example, the first polygon 102 is represented by a first mandrel pattern 152 surrounded by a first spacer material 154, and the second polygon 104 is represented by a second mandrel pattern 156 surrounded by a second spacer material 158. In another example, the first polygon 102 is represented by a first passive fill pattern 164 formed relative to a third spacer material 162 surrounding a third mandrel pattern 160, such as a dummy mandrel pattern, and the second polygon 104 is represented by a second passive fill pattern 166 formed relative to the third spacer material 162 surrounding the third mandrel pattern 160.

In an example, a fifth spacing threshold range 170 corresponds to a fifth spacing between the first polygon 102 and the second polygon 104. For example, the fifth spacing is relatively larger than the fourth spacing corresponding to the fourth spacing threshold range 150. Based upon the fifth spacing, the first polygon 102 and the second polygon 104 can be formed based upon the same-process pattern rule or the different-process pattern rule. In an example of the same-process pattern rule, the first polygon 102 is represented by a first passive fill pattern 194 formed relative to a first spacer material 199 surrounding a first mandrel pattern 196, such as a dummy mandrel pattern, and the second polygon 104 is represented by a second fill pattern 198 formed relative to the first spacer material 199 surrounding the first mandrel pattern 196. In another example of the same-process pattern rule, the first polygon 102 is represented by a second mandrel pattern 190 surrounded by a second spacer material 186, and the second polygon 104 is represented by a third mandrel pattern 192 surrounded by a third spacer material 188. In an example of the different-process pattern rule, the first polygon 102 is represented by a fourth mandrel pattern 172 surrounded by a fourth spacer material 174, and the second polygon 104 is represented by a third passive fill pattern 182 formed between a fifth spacer material 178 surrounding a fifth mandrel pattern 176, such as a dummy mandrel pattern, and a sixth spacer material 184 surrounding a fifth mandrel pattern 180, such as a dummy mandrel pattern. In this way, one or more polygons within a design layout of an electrical component can be generated based upon such process pattern design rules, which can mitigate self-aligned multiple patterning (SAMP) conflicts.

Figure 2:
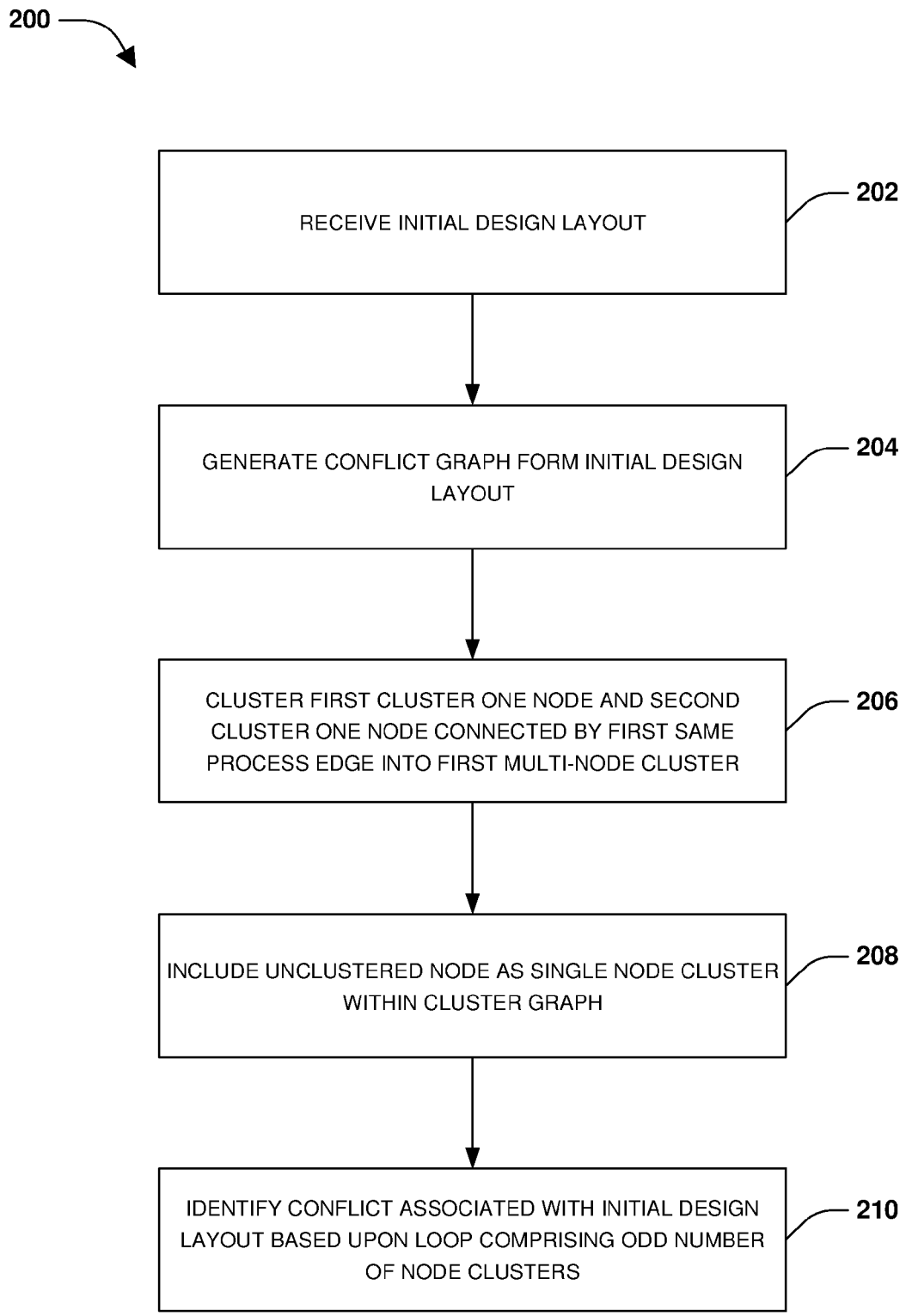
FIG. 2 is a flow diagram illustrating an example method of performing design layout, according to some embodiments.
Figure 4:
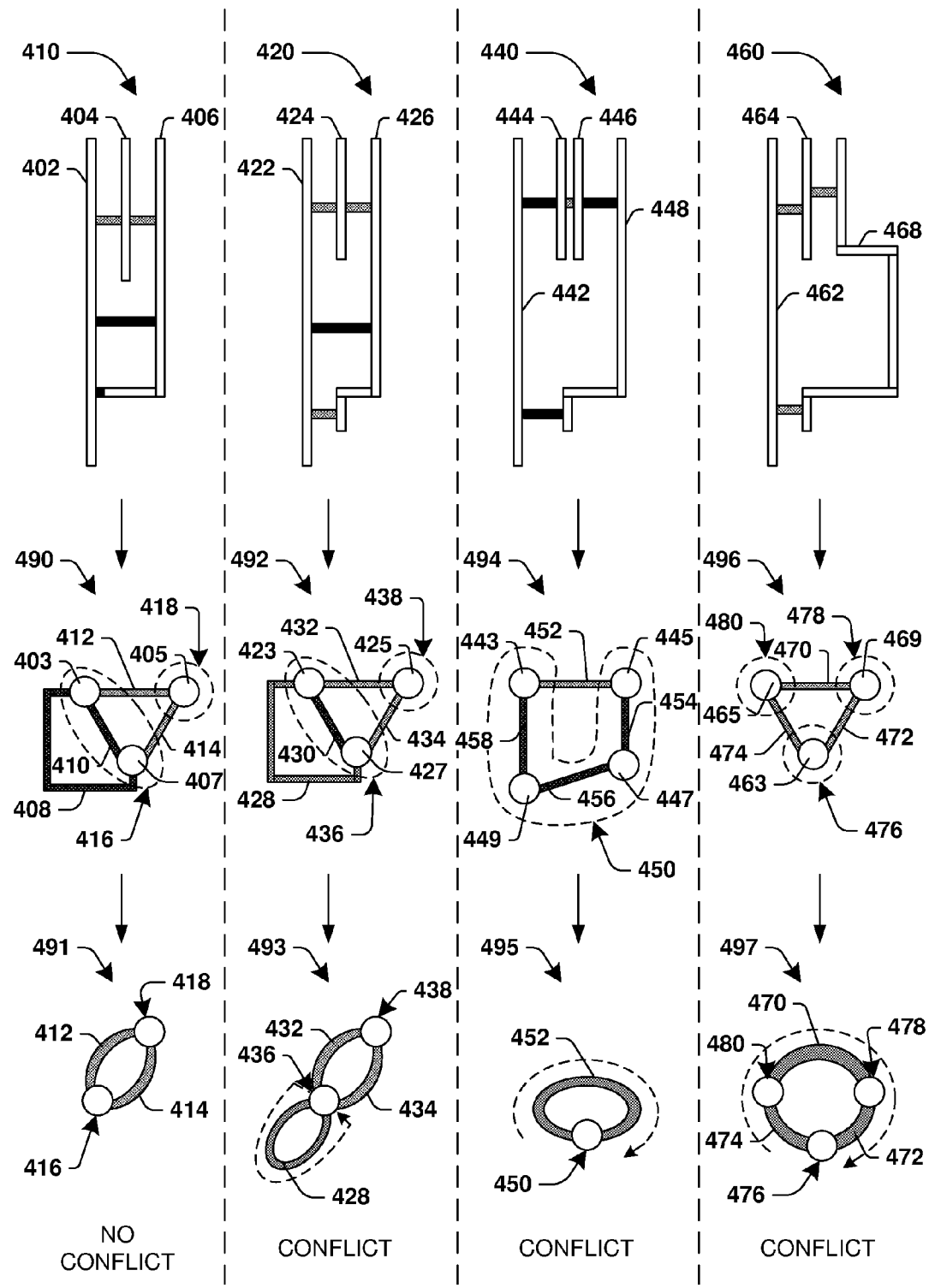
FIG. 4 is an illustration of one or more conflict graphs and one or more cluster graphs, according to some embodiments.

An exemplary method 200 of performing design layout, according to some embodiments, is illustrated in FIG. 2, and exemplary design layouts evaluated by such a methodology are illustrated in FIG. 4. At 202, an initial design layout associated with an electrical component, such as a standard cell, is received. The initial design layout comprises one or more polygons that are to be formed to create the electrical component. It is appreciated that four different examples, such as an example 410, an example 420, an example 440, and an example 460, are described in conjunction with exemplary method 200 for illustrative purposes to show initial design layouts having either conflicts or no conflicts. In the example 410 of FIG. 4, a first initial design layout comprises a first polygon 402, a second polygon 404, and a third polygon 406. In the example 420 of FIG. 4, a second initial design layout comprises a first polygon 422, a second polygon 424, and a third polygon 426. In the example 440 of FIG. 4, a third initial design layout comprises a first polygon 444, a second polygon 446, a third polygon 448, and a fourth polygon 442. In the example 460, a fourth initial design layout comprises a first polygon 462, a second polygon 464, and a third polygon 468. As provided herein, conflict detection and correction is facilitated so that a design layout that is self-aligned multiple patterning (SAMP) compliant can be generated from the initial design layout.

At 204, a conflict graph is generated from the initial design layout. The conflict graph comprises one or more nodes connected by one or more edges. A node represents a polygon within the initial design layout. An edge specifies whether two nodes connected by the edge are to be formed from the same pattern process or formed by different pattern processes. In an example, a same-process edge, connecting a first node and a second node, specifies that the first node and the second node are to both be generated by a first pattern process, such as a mandrel pattern process. In an example, a different-process edge, connecting a third node and a fourth node, specifies that the third node is to be formed by the first pattern process, such as the mandrel pattern process, and that the fourth node is to be formed by a second pattern process, such as a passive fill pattern process.

In example 410 of FIG. 4, a first conflict graph 490 is generated from the first initial design layout. The first conflict graph 490 comprises a first node 403 representing the first polygon 402, a second node 405 representing the second polygon 404, and a third node 407 representing the third polygon 406. A first different-process edge 412 connects the first node 403 and the second node 405 based upon spacing between the first node 403 and the second node 405 corresponding to a spacing threshold range specifying that the first node 403 and the second node 405 are to be formed by different pattern processes. A second different-process edge 414 connects the second node 405 and the third node 407 based upon spacing between the second node 405 and the third node 407 corresponding to a spacing threshold range specifying that the second node 405 and the third node 407 are to be formed by the different pattern processes. A first same-process edge 408 connects the first node 403 and the third node 407 based upon spacing between the first node 403 and the third node 407 corresponding to a spacing threshold range specifying that the first node 403 and the third node 407 are to be formed by the same pattern process. A second same-process edge 410 connects the first node 403 and the third node 407 based upon spacing between the first node 403 and the third node 407 corresponding to a spacing threshold range specifying that the first node 403 and the third node 407 are to be formed by the same pattern process. In this way, the first conflict graph 490 is generated from the first initial design layout in example 410.

In example 420 of FIG. 4, a second conflict graph 492 is generated from the second initial design layout. The second conflict graph 492 comprises a first node 423 representing the first polygon 422, a second node 425 representing the second polygon 424, and a third node 427 representing the third polygon 426. The second conflict graph 492 comprises one or more edges that specify whether polygon pairings, such as two polygons represented by two nodes connected by an edge, are to be formed by the same or different pattern processes based upon spacing between such polygons. A first different-process edge 432 connects the first node 423 and the second node 425. A second different-process edge 434 connects the second node 425 and the third node 427. A third different-process edge 428 connects the first node 423 and the third node 427. A first same-process edge 430 connects the first node 423 and the third node 427. In this way, the second conflict graph 492 is generated from the second initial design layout in example 420.

In example 440 of FIG. 4, a third conflict graph 494 is generated from the third initial design layout. The third conflict graph 494 comprises a first node 443 representing the first polygon 444, a second node 445 representing the second polygon 446, a third node 447 representing the third polygon 448, and a fourth node 449 representing the fourth polygon 442. The third conflict graph 494 comprises one or more edges that specify whether polygon pairings, such as two polygons represented by two nodes connected by an edge, are to be formed by the same or different pattern processes based upon spacing between such polygons. A first different-process edge 452 connects the first node 443 and the second node 445. A first same-process edge 454 connects the second node 445 and the third node 447. A second same-process edge 456 connects the third node 447 and the fourth node 449. A third same-process edge 458 connects the fourth node 449 and the first node 443. In this way, the third conflict graph 494 is generated from the third initial design layout in example 440.

In example 460 of FIG. 4, a fourth conflict graph 496 is generated from the fourth initial design layout. The fourth conflict graph 496 comprises a first node 463 representing the first polygon 462, a second node 465 representing the second polygon 464, and a third node 469 representing the third polygon 468. The fourth conflict graph 496 comprises one or more edges that specify whether polygon pairings, such as two polygons represented by two nodes connected by an edge, are to be formed by the same or different pattern processes based upon spacing between such polygons. A first different-process edge 470 connects the second node 465 and the third node 469. A second different-process edge 472 connects the third node 469 and the first node 463. A third different-process edge 474 connects the first node 463 and the second node 465. In this way, the fourth conflict graph 496 is generated from the fourth initial design layout in example 460.

At 206, responsive to a conflict graph comprising at least one same-process edge, a first cluster one node and a second cluster one node connected by a first same-process edge are clustered into a first multi-node cluster for inclusion within a cluster graph. In an example, a cluster one node is a node that is connected to one or more other cluster one nodes by same-process edges, such that the cluster one nodes are identified for inclusion within the first multi-node cluster. A multi-node cluster can comprise two or more nodes, such as a third cluster one node connected to at least one of the first cluster one node or the second cluster one node by a same-process edge. In another example, a cluster two node is a node that is connected to one or more other cluster two nodes, but not a cluster one node, by same-process edges, such that the cluster two nodes are identified for inclusion within a second multi-node cluster. In this way, one or more multi-node clusters are generated based upon nodes interconnected by same-process edges. At 208, for respective unclustered nodes, an unclustered node is included as a single node cluster within the cluster graph. A single node cluster comprises a single node. At 210, for respective loops within the clustered graph, a conflict associated with the initial design layout is identified based upon a loop comprising an odd number of node clusters.

In example 410 of FIG. 4, a first cluster graph 491 is generated based upon one or more clusters identified from the first conflict graph 490. For example, the first node 403 and the third node 407 are clustered into a first multi-node cluster 416 based upon the first node 403 and the third node 407 being connected by at least one same-process edge, such as the first same-process edge 408 or the second same-process edge 410. The second node 405 is clustered into a first single node cluster 418. In this way, the first conflict graph 490 comprises a single loop corresponding to the first multi-node cluster 416 connected to the first single node cluster 418 by the first different-process edge 412 and the second different-process edge 414. Because the single loop comprises an even number of node clusters, the first multi-node cluster 416 and the first single node cluster 418, no conflicts are detected for the first initial design layout.

In example 420 of FIG. 4, a second cluster graph 493 is generated based upon one or more clusters identified from the second conflict graph 492. For example, the first node 423 and the third node 427 are clustered into a first multi-node cluster 436 based upon the first node 423 and the third node 427 being connected by the first same-process edge 430. The second node 425 is clustered into a first single node cluster 438. In this way, the second cluster graph 493 comprises a first loop and a second loop. The first loop corresponds to the first multi-node cluster 436 connected to itself by the third different-process edge 428, and the second loop corresponds to the first multi-node cluster 436 connected to the first single node cluster 438 by the first different-process edge 432 and the second different-process edge 434. Because the first loop comprises an odd number of node clusters, the first multi-node cluster 436, a conflict is detected for the second initial design layout. In an example, the conflict is displayed within a visualization of the second initial design layout. In an example, a spacing constraint recommendation for the conflict is provided. In an example, the spacing constraint recommendation provides a suggested spacing between one or more polygons, which can result in removal of an edge or modification of an edge type. For example, the spacing constraint recommendation specifies an increase in spacing between the first polygon 422 and a lower portion of the third polygon 426. The increase spacing can result in the third different-process edge 428 changing to a same-process edge type because the increased spacing can correspond to a spacing threshold range specifying a same-process edge type. In an example of displaying the conflict, one or more mandrel pattern layers for the second initial design layout are displayed. A mandrel pattern comprises at least one of a mandrel or dummy mandrel surrounded at least in part by spacer. One or more trim pattern layers are displayed. In this way, a designer of the second initial design layout can visualize the conflict and modify the second initial design layout accordingly. In an example, responsive to a modification of the second initial design layout to resolve the conflict, a design layout, which can be verified as self-aligned multiple patterning (SAMP) compliant, can be generated based at least in part upon the modified second initial design layout.

In example 440 of FIG. 4, a third cluster graph 495 is generated based upon one or more clusters identified from the third conflict graph 494. For example, a first node 443, a second node 445, a third node 447, and a fourth node 449 are clustered into a first multi-node cluster 450 based upon such nodes being connected by same-process edges, such as the first same-process edge 454, the second same-process edge 456, and the third same-process edge 458. In this way, the third cluster graph 495 comprises a single loop corresponding to the first multi-node cluster 450 being connected to itself by the first different-process edge 452. Because the single loop comprises an odd number of node clusters, the first multi-node cluster 450, a conflict is detected for the third initial design layout. The conflict can be illustrated within a visualization of the third initial design layout, and a spacing constraint recommendation can be provided for the conflict. Responsive to a modification of the third initial design layout to resolve the conflict, a design layout, which can be verified as self-aligned multiple patterning compliant, can be generated based at least in part upon the modified third initial design layout.

In example 460 of FIG. 4, a fourth cluster graph 497 is generated based upon one or more clusters identified from the fourth conflict graph 496. For example, a first node 463 is clustered into a first single node cluster 476. A second node 465 is clustered into a second single node cluster 480. A third node 469 is clustered into a third single node cluster 478. In this way, the fourth cluster graph 497 comprises a single loop corresponding to the first single node cluster 476 being connected to the second single node cluster 480 by the third different-process edge 474, the second single node cluster 480 being connected to the third single node cluster 478 by the first different-process edge 470, and the third single node cluster 478 being connected to the first single node cluster 476 by the second different-process edge 472. Because the single loop comprises an odd number of node clusters, the first single node cluster 476, the second single node cluster 480, and the third single node cluster 478, a conflict is detected for the fourth initial design layout. The conflict can be illustrated within a visualization of the fourth initial design layout, and a spacing constraint recommendation can be provided for the conflict. Responsive to a modification of the fourth initial design layout to resolve the conflict, a design layout, which can be verified as self-aligned multiple patterning compliant, can be generated based at least in part upon the modified fourth initial design layout.

Figure 3:
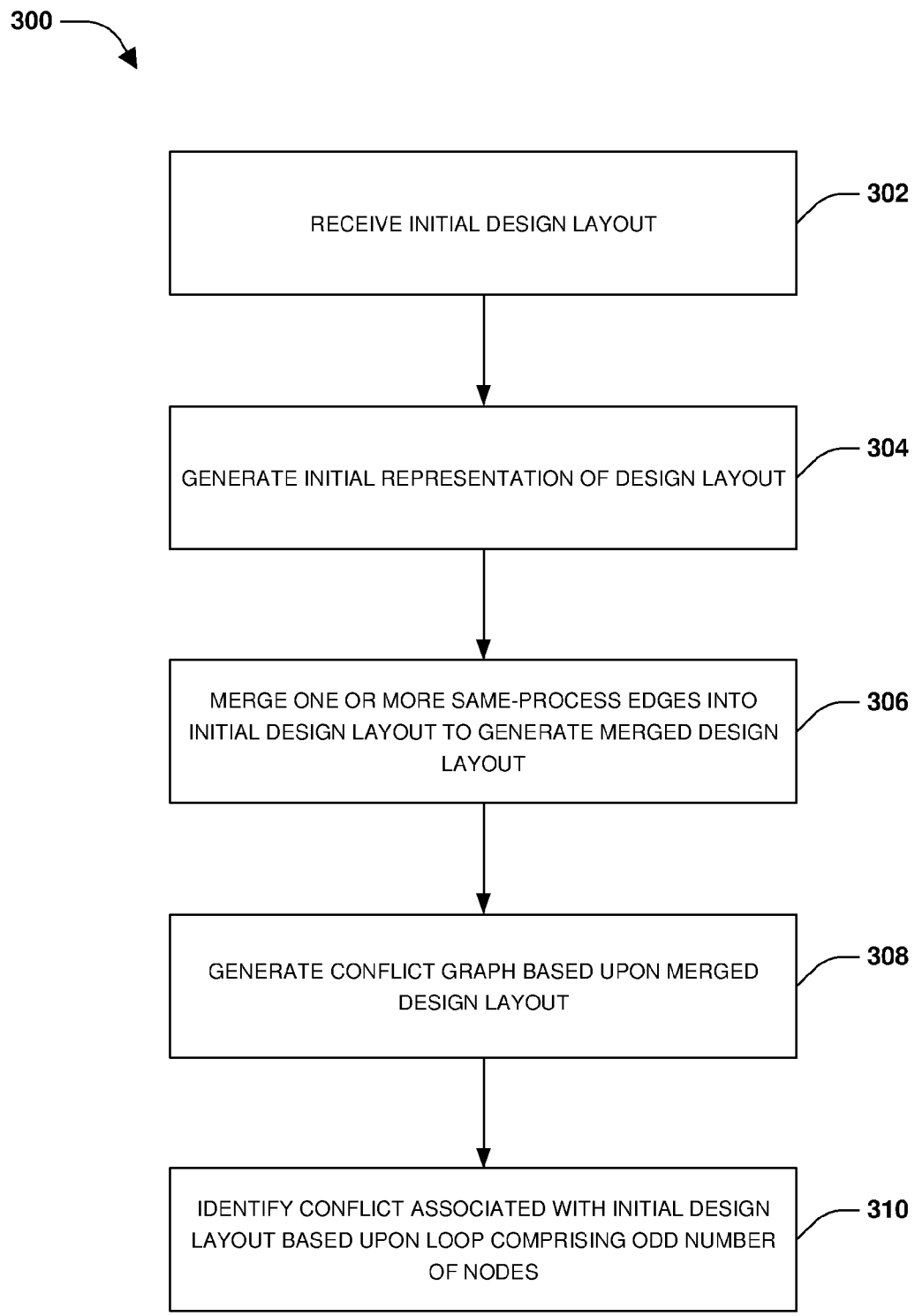
FIG. 3 is a flow diagram illustrating an example method of performing design layout, according to some embodiments.

An exemplary method 300 of performing design layout, according to some embodiments, is illustrated in FIG. 3. At 302, an initial design layout associated with an electrical component is received. At 304, an initial representation of the initial design layout is generated. The initial representation comprises one or more nodes connected by one or more edges. A node represents a polygon in the initial design layout. An edge, connecting two nodes, specifies whether the two nodes are to be formed by the same pattern process or by different pattern processes based upon spacing, between polygons represented by the two nodes, corresponding to a particular spacing threshold range. In an example, a same-process edge connects a first node that is to be generated by a first pattern process, such as a mandrel pattern process, and a second node that is to be formed by the first pattern process. In another example, a different-process edge connects a third node that is to be generated by the first pattern process, such as the mandrel pattern process, and a fourth node that is to be formed by a second pattern process, such as a passive fill pattern process.

At 306, responsive to the initial representation comprising at least one same-process edge, one or more same-process edges are merged into the initial design layout to generate a merged design layout. At 308, a conflict graph is generated based upon the merged design layout. The conflict graph comprises one or more nodes connected by one or more different-process edges. In an example, the conflict graph does not comprise a same-process edge because the one or more same-process edges were merged into the initial design layout. At 310, for respective loops within the conflict graph, a conflict associated with the initial design layout is identified based upon the loop comprising an odd number of nodes. In this way, the conflict is identified and presented. Responsive to modification of the initial design layout to resolve the conflict, a design layout is generated based upon the modified initial design layout. The design layout can be verified, baring no other conflicts, as self-alignment multiple pattern (SAMP) compliant before at least one of generation of one or more mandrel pattern layers or generation of one or more trim pattern layers. Once verified, one or more mandrel pattern layers for the design layout are generated. A mandrel pattern layer comprises mandrel surrounded at least in part by spacer. One or more trim pattern layers are generated for the design layout, such that a portion of the design layout covered by a trim pattern layer is either removed or retained based upon a trimming technique used, such as a negative or a positive trim technique.

Figure 5:
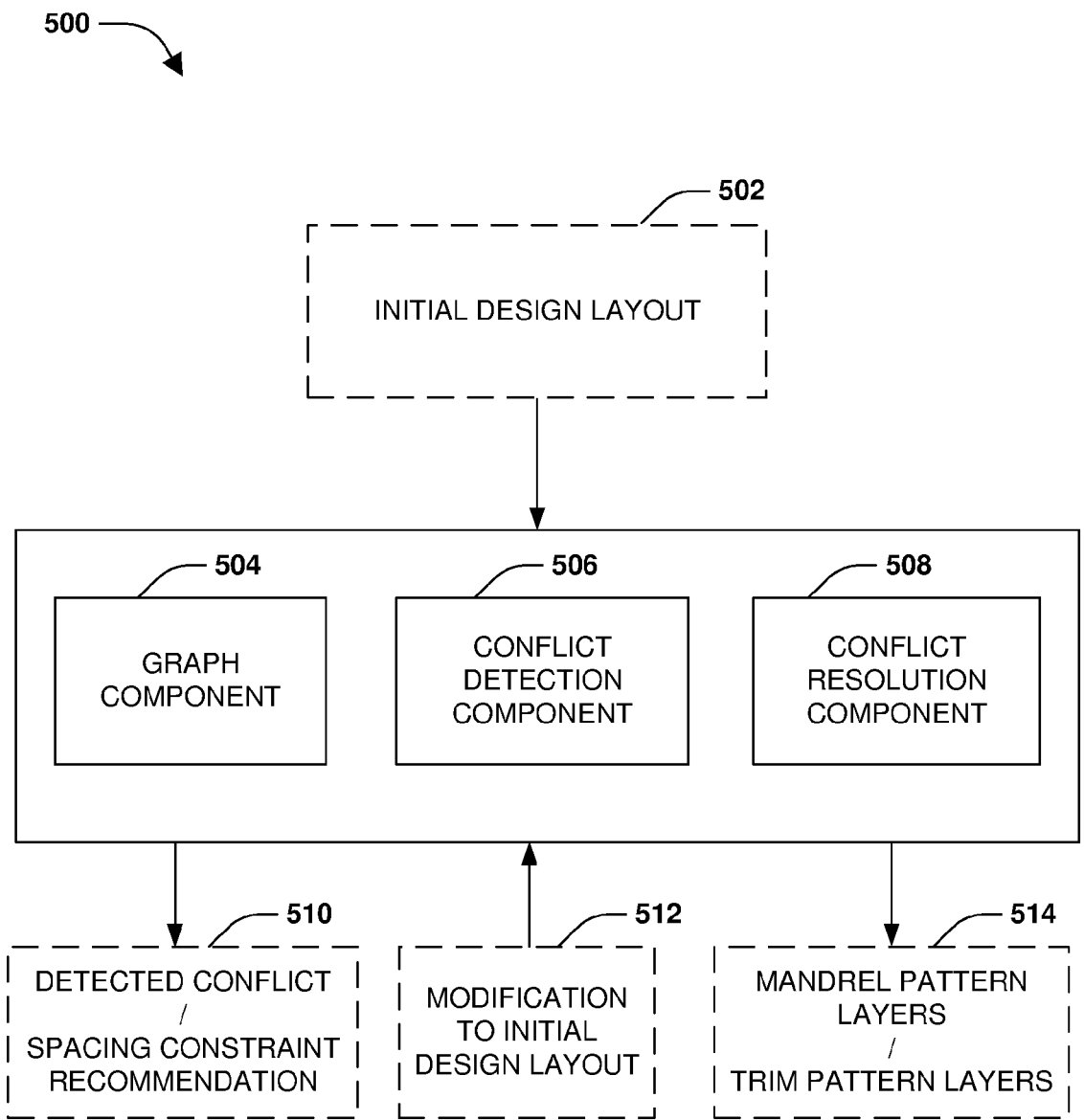
FIG. 5 is a component block diagram illustrating an exemplary system for performing design layout, according to some embodiments.

FIG. 5 illustrates an example, according to some embodiments, of a system 500 for performing design layout. The system 500 comprises a graph component 504, a conflict detection component 506, and a confliction resolution component 508. The graph component 504 is configured to receive an initial design layout 502 associated with an electrical component, such as a standard cell. The graph component 504 is configured to generate a conflict graph, such as conflict graphs 490, 492, 494, 496 of FIG. 4. The conflict graph comprises one or more nodes connected by one or more edges. For example, an edge, between a first node and a second node, comprises an edge type that is identified based upon a space, between a first polygon represented by the first node and a second polygon represented by the second node, corresponding to a spacing threshold range assigned to the edge type. In an example, the edge type comprises a same-process edge type indicating that two nodes connected by a same-process edge are to be generated by the same pattern process. In another example, the edge type comprises a different-process edge type indicating that two nodes connected by a different-process edge are to be generated by different patterning processes. In an example. the graph component 504 is configured to cluster one or more nodes within the cluster graph. For example, responsive to the conflict graph comprising at least one same-process edge, the graph component 504 is configured to cluster a first cluster one node and a second cluster one node connected by a first same-process edge into a first multi-node cluster for inclusion within the conflict graph, such as a cluster graph. For respective unclustered nodes, the graph component 504 is configured to include an unclustered node as a single node cluster within the cluster graph.

The conflict detection component 506 is configured to identify a conflict within the initial design layout 502, such as a self-aligned multiple pattern (SAMP) conflict, using the conflict graph or the cluster graph. For example, for respective loops within the conflict graph, a conflict associated with the initial design layout 502 is detected based upon the loop comprising an odd number of nodes. The conflict detection component 506 is configured to provide 510 at least one of the conflict or a spacing constraint recommendation that can be used to resolve the conflict. The conflict resolution component 508 is configured to receive a modification 512 to the initial design layout 502, resulting in a modified initial design layout. The conflict resolution component 508 is configured to generate a design layout, such as an SAMP compliant design layout, based upon the modified initial design layout. The conflict resolution component 508 is configured to generate 514 at least one of one or more mandrel pattern layers for the design layout or one or more trim pattern layouts for the design layout. In this way, one or more polygons within the design layout are formed by at least one of mandrel pattern or passive fill pattern.

According to an aspect of the instant disclosure, a method for performing design layout is provided. The method comprises, receiving an initial design layout associated with an electrical component. A conflict graph is generated from the initial design layout. The conflict graph comprises one or more nodes connected by one or more edges. A node represents a polygon within the initial design layout. An edge comprises at least one of a same-process edge or a different-process edge. In an example, a same-process edge, connecting a first node and a second node, specifies that the first node and the second node are to be generated by a first pattern process, such as a mandrel pattern process. In another example, a different-process edge, connecting a third node and a fourth node, specifies that the third node is to be generated by the first pattern process and that the fourth node is to be generated by a second pattern process, such as a fill pattern process. In some embodiments, responsive to the conflict graph comprising at least one same-process edge, a first cluster one node and a second cluster one node connected by a first same-process edge are clustered into a first multi-node cluster for inclusion within a cluster graph. For respective unclustered nodes, an unclustered node is included as a single node cluster within the cluster graph. For respective loops within the cluster graph, a conflict associated with the initial design layout is identified based upon a loop comprising an odd number of node clusters.

According to an aspect of the instant disclosure, a method for performing design layout is provided. The method comprises, receiving an initial design layout associated with an electrical component. An initial representation of the initial design layout is generated from the initial design layout. The initial representation graph comprises one or more nodes connected by one or more edges. A node represents a polygon within the initial design layout. An edge comprises at least one of a same-process edge or a different-process edge. In an example, a same-process edge, connecting a first node and a second node, specifies that the first node and the second node are to be generated by a first pattern process, such as a mandrel pattern process. In another example, a different-process edge, connecting a third node and a fourth node, specifies that the third node is to be generated by the first pattern process and that the fourth node is to be generated by a second pattern process, such as a fill pattern process. In some embodiments, responsive to the initial representation comprising at least one same-process edge, merging one or more same-process edges into the initial design layout to generate a merged design layout. A conflict graph is generated based upon the merged design layout. The conflict graph comprises one or more nodes connected by one or more different-process edges. For respective loops within the conflict graph, a conflict associated with the initial design layout is identified based upon a loop comprising an odd number of nodes.

According to an aspect of the instant disclosure, a system for performing design layout is provided. The system comprises a graph component and a conflict detection component. The graph component is configured to receive an initial design layout associated with an electrical component. The graph component is configured to generate a conflict graph from the initial design layout. The conflict graph comprises one or more nodes connected by one or more edges. A node represents a polygon within the initial design layout. An edge, between a first node and a second node, comprises an edge type, such as a same-process edge type or a different-process edge type, identified based upon a space, between a first polygon represented by the first node and a second polygon represented by the second node, corresponding to a spacing threshold range assigned to the edge type. The conflict detection component is configured to identify a conflict associated with the initial design layout based upon a loop within the conflict graph comprising an odd number of nodes.

Figure 6:
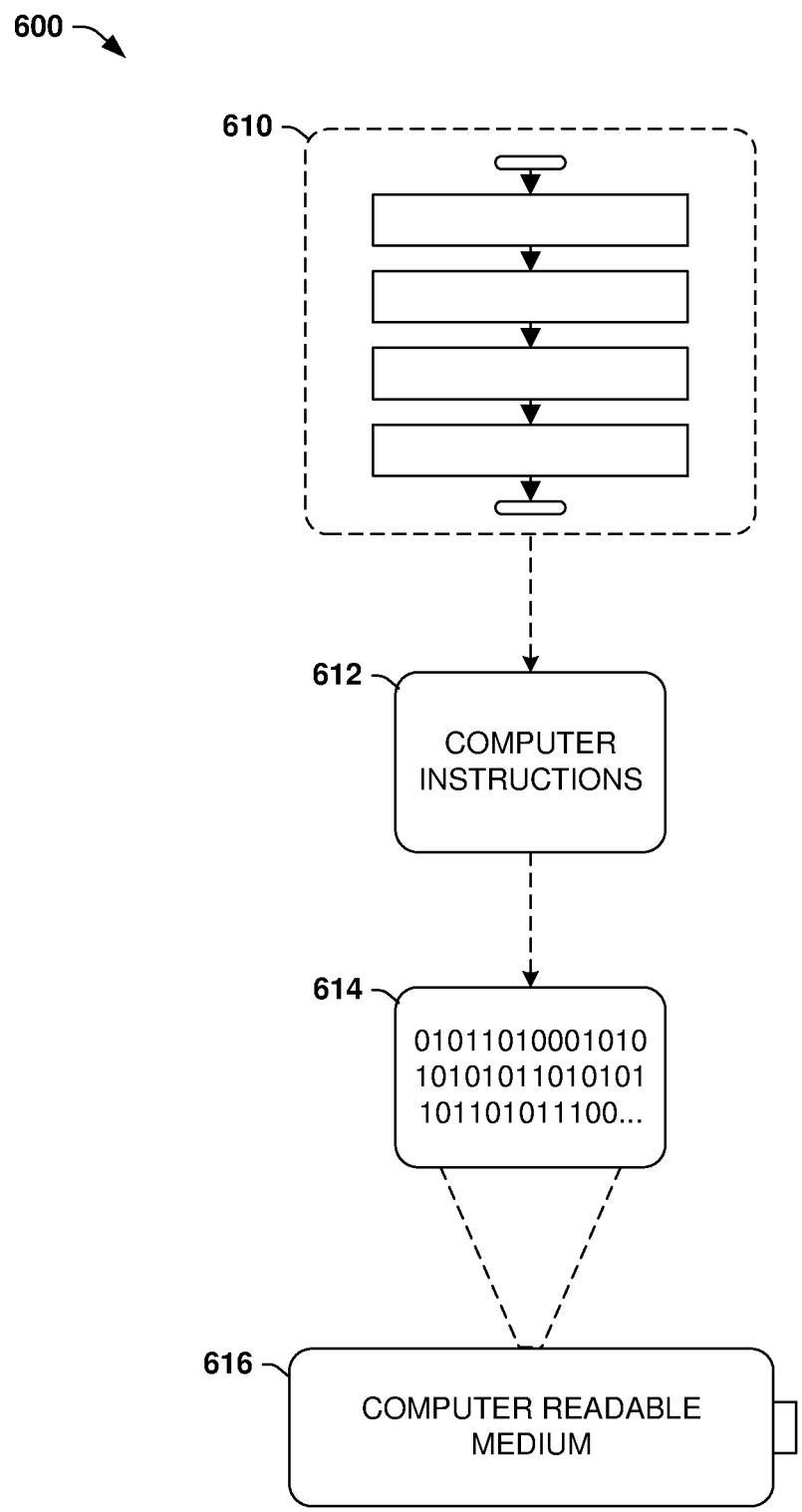
FIG. 6 is an illustration of an example computer-readable medium wherein processor-executable instructions configured to embody one or more of the provisions set forth herein may be comprised.

Still another embodiment involves a computer-readable medium comprising processor-executable instructions configured to implement one or more of the techniques presented herein. An exemplary computer-readable medium that may be devised in these ways is illustrated in FIG. 6, wherein the implementation 600 comprises a computer-readable medium 616 (e.g., a CD-R, DVD-R, flash drive, a platter of a hard disk drive, etc.), on which is encoded computer-readable data 614. This computer-readable data 614 in turn comprises a set of computer instructions 612 configured to operate according to one or more of the principles set forth herein. In one such embodiment 600, the processor-executable computer instructions 612 may be configured to perform a method 610, such as at least some of the exemplary method 200 of FIG. 2 and/or at least some of the exemplary method 300 of FIG. 3, for example. In another such embodiment, the processor-executable instructions 612 may be configured to implement a system, such as at least some of the exemplary system 500 of FIG. 5, for example. Many such computer-readable media may be devised by those of ordinary skill in the art that are configured to operate in accordance with the techniques presented herein.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used in this application, the terms "component," "module," "system", "interface", and the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

Figure 7:
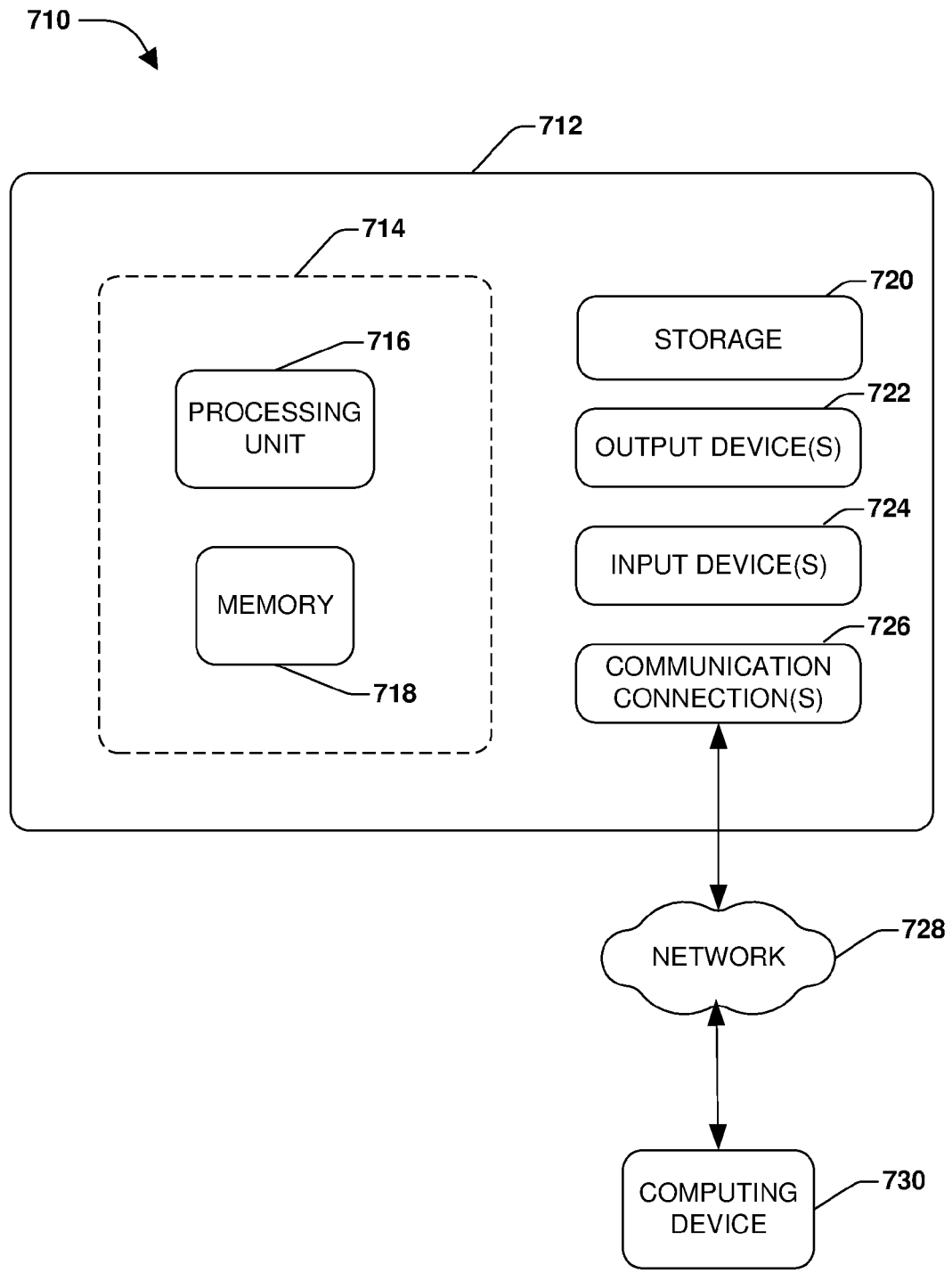
FIG. 7 illustrates an example computing environment wherein one or more of the provisions set forth herein may be implemented.

FIG. 7 and the following discussion provide a brief, general description of a suitable computing environment to implement embodiments of one or more of the provisions set forth herein. The operating environment of FIG. 7 is only one example of a suitable operating environment and is not intended to suggest any limitation as to the scope of use or functionality of the operating environment. Example computing devices include, but are not limited to, personal computers, server computers, hand-held or laptop devices, mobile devices (such as mobile phones, Personal Digital Assistants (PDAs), media players, and the like), multiprocessor systems, consumer electronics, mini computers, mainframe computers, distributed computing environments that include any of the above systems or devices, and the like.

Although not required, embodiments are described in the general context of "computer readable instructions" being executed by one or more computing devices. Computer readable instructions may be distributed via computer readable media (discussed below). Computer readable instructions may be implemented as program modules, such as functions, objects, Application Programming Interfaces (APIs), data structures, and the like, that perform particular tasks or implement particular abstract data types. Typically, the functionality of the computer readable instructions may be combined or distributed as desired in various environments.

FIG. 7 illustrates an example of a system 710 comprising a computing device 712 configured to implement one or more embodiments provided herein. In one configuration, computing device 712 includes at least one processing unit 716 and memory 718. Depending on the exact configuration and type of computing device, memory 718 may be volatile (such as RAM, for example), non-volatile (such as ROM, flash memory, etc., for example) or some combination of the two. This configuration is illustrated in FIG. 7 by dashed line 714.

In other embodiments, device 712 may include additional features and/or functionality. For example, device 712 may also include additional storage (e.g., removable and/or non-removable) including, but not limited to, magnetic storage, optical storage, and the like. Such additional storage is illustrated in FIG. 7 by storage 720. In some embodiments, computer readable instructions to implement one or more embodiments provided herein may be in storage 720. Storage 720 may also store other computer readable instructions to implement an operating system, an application program, and the like. Computer readable instructions may be loaded in memory 718 for execution by processing unit 716, for example.

The term "computer readable media" as used herein includes computer storage media. Computer storage media includes volatile and nonvolatile, removable and non-removable media implemented in any method or technology for storage of information such as computer readable instructions or other data. Memory 718 and storage 720 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by device 712. Any such computer storage media may be part of device 712.

The term "computer readable media" may include communication media. Communication media typically embodies computer readable instructions or other data in a "modulated data signal" such as a carrier wave or other transport mechanism and includes any information delivery media. The term "modulated data signal" may include a signal that has one or more of its characteristics set or changed in such a manner as to encode information in the signal.

Device 712 may include input device(s) 724 such as keyboard, mouse, pen, voice input device, touch input device, infrared cameras, video input devices, and/or any other input device. Output device(s) 722 such as one or more displays, speakers, printers, and/or any other output device may also be included in device 712. Input device(s) 724 and output device(s) 722 may be connected to device 712 via a wired connection, wireless connection, or any combination thereof. In some embodiments, an input device or an output device from another computing device may be used as input device(s) 724 or output device(s) 722 for computing device 712. Device 712 may also include communication connection(s) 726 to facilitate communications with one or more other devices.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims.

What is claimed is:

1. A system for performing design layout, comprising:
   a graph component configured to:
     receive an initial design layout associated with an electrical component; and
     generate a conflict graph from the initial design layout, the conflict graph comprising one or more nodes coupled by one or more edges, an edge, between a first node and a second node, comprising an edge type identified based upon a space, between a first polygon represented by the first node and a second polygon represented by the second node, corresponding to a spacing threshold range assigned to the edge type; and
   a conflict detection component configured to:
     for respective loops within the conflict graph, identify a conflict associated with the initial design layout based upon a loop comprising an odd number of nodes.

2. The system of claim 1, the graph component configured to:
   responsive to the conflict graph comprising at least one same-process edge, cluster a first cluster one node and a second cluster one node coupled by a first same-process edge into a first multi-node cluster for inclusion within the conflict graph; and
   for respective unclustered nodes, include an unclustered node as a single node cluster within the conflict graph.

3. The system of claim 1, comprising:
   a conflict resolution component configured to:
     responsive to a modification of the initial design layout to resolve the conflict, generate a design layout based upon the modification of the initial design layout;
     generate one or more mandrel pattern layers for the design layout, a mandrel pattern layer comprising mandrel surrounded at least in part by spacer; and
     generate one or more trim pattern layers for the design layout.

4. The system of claim 1, the edge type comprising at least one of a same-process edge type or a different-process edge type.

5. A method for performing design layout, comprising:
   receiving an initial design layout associated with an electrical component;
   generating a conflict graph from the initial design layout, the conflict graph comprising:
     a first node representing a first polygon of the initial design layout;
     a second node representing a second polygon of the initial design layout, the second node coupled to the first node by a same-process edge; and
     a third node representing a third polygon of the initial design layout, the third node coupled to the second node by a different-process edge;
   updating the conflict graph to remove the same-process edge and generate an updated conflict graph; and
   for respective loops within the updated conflict graph, identifying a conflict associated with the initial design layout based upon a loop comprising an odd number of nodes, wherein the method is implemented by a processing unit that executes processor-executable instructions stored on a non-transitory computer-readable medium.

6. The method of claim 5, comprising:
   selecting the same-process edge for coupling the first node to the second node based upon a spacing between the first node and the second node corresponding to a first spacing threshold range; and selecting the different-process edge for coupling the second node to the third node based upon a spacing between the second node and the third node corresponding to a second spacing threshold range.

7. The method of claim 5, the updating comprising:

clustering the first node and the second node into a multi-node cluster responsive to the second node being coupled to the first node by the same-process edge.

8. The method of claim 7, the loop comprising the multi-node cluster, the third node, and the different-process edge.

9. The method of claim 7, the third node coupled to the first node by a second different-process edge.

10. The method of claim 9, the loop comprising the multi-node cluster, the third node, the different-process edge, and the second different-process edge.

11. The method of claim 5, comprising displaying the conflict within a visualization of the initial design layout.

12. The method of claim 11, the displaying comprising:

providing a spacing constraint recommendation for the conflict.

13. The method of claim 5, comprising:

modifying the initial design layout to resolve the conflict and to generate a modified initial design layout.

14. The method of claim 13, the modifying the initial design layout comprising:

applying at least one of a min space rule, an island rule, an isolated trench rule, a corner-to-corner rule, or a flip assignment rule to the initial design layout.

15. A method for performing design layout, comprising:

receiving an initial design layout associated with an electrical component;

generating a conflict graph from the initial design layout, the conflict graph comprising:

a first node representing a first polygon of the initial design layout;

a second node representing a second polygon of the initial design layout, the second node coupled to the first node by a same-process edge; and a third node representing a third polygon of the initial design layout, the third node coupled to the second node by a different-process edge;

clustering the first node and the second node into a multi-node cluster responsive to the second node being coupled to the first node by the same-process edge to generate an updated conflict graph; and for respective loops within the updated conflict graph, identifying a conflict associated with the initial design layout based upon a loop comprising an odd number of nodes, wherein the method is implemented by a processing unit that executes processor-executable instructions stored on a non-transitory computer-readable medium.

16. The method of claim 15, comprising displaying the conflict within a visualization of the initial design layout.

17. The method of claim 16, the displaying comprising:

providing a spacing constraint recommendation for the conflict.

18. The method of claim 15, comprising:

modifying the initial design layout to resolve the conflict and to generate a modified initial design layout.

19. The method of claim 18, the modifying the initial design layout comprising:

applying at least one of a min space rule, an island rule, an isolated trench rule, a corner-to-corner rule, or a flip assignment rule to the initial design layout.

20. The method of claim 15, the loop comprising the multi-node cluster, the third node, and the different-process edge.

* * * * *